United States Patent
Iida et al.

(10) Patent No.: US 6,287,933 B1
(45) Date of Patent: Sep. 11, 2001

(54) SEMICONDUCTOR DEVICE HAVING THIN FILM RESISTOR AND METHOD OF PRODUCING SAME

(75) Inventors: Makio Iida, Ichinomiya; Shoji Miura; Kanemitsu Terada, both of Anjo; Hiroyuki Ban, Hazu-gun; Kiyoshi Yamamoto, Kariya; Katsuyoshi Oda, Gamagori; Yoshihiko Isobe, Obu, all of (JP)

(73) Assignee: Nippondenso Co., Ltd., Aichi (JP)

( * ) Notice: Subject to any disclaimer, the term of this patent is extended or adjusted under 35 U.S.C. 154(b) by 0 days.

(21) Appl. No.: 08/015,268

(22) Filed: Jan. 3, 1992

Related U.S. Application Data

(63) Continuation of application No. 07/680,011, filed on Apr. 2, 1991, which is a continuation of application No. 07/379,775, filed on Jul. 14, 1989, now abandoned.

(30) Foreign Application Priority Data

Jul. 15, 1988 (JP) ................................. 63-177536
Apr. 12, 1989 (JP) ...................................... 1-92610
Jun. 14, 1989 (JP) ..................................... 1-151284

(51) Int. Cl.$^7$ .................................................. H01L 21/20
(52) U.S. Cl. ......................... 438/382; 438/381; 438/384
(58) Field of Search ............ 437/918, 60; 148/DIG. 136

(56) References Cited

U.S. PATENT DOCUMENTS

| | | | |
|---|---|---|---|
| 3,381,255 | 4/1968 | Youmans | 338/308 |
| 4,391,846 | 7/1983 | Raymond . | |
| 4,392,992 | 7/1983 | Paulson et al. . | |
| 4,510,178 | * 4/1985 | Paulson et al. | 437/918 |
| 4,520,342 | 5/1985 | Vugts . | |
| 4,569,742 | * 2/1986 | Schuetz | 338/308 |
| 4,591,821 | * 5/1986 | Paulson et al. | 338/308 |
| 4,682,143 | * 7/1987 | Chu et al. | 204/198.21 |
| 4,746,896 | * 5/1988 | Mcquaid | 338/308 |
| 4,758,321 | * 7/1988 | Vugts | 204/192.21 |

FOREIGN PATENT DOCUMENTS

| | | | |
|---|---|---|---|
| 0101632 | 2/1984 | (EP) . | |
| 50-038200 | 4/1975 | (JP) . | |
| 53-25442 | 3/1978 | (JP) | H01C/7/00 |
| 60-261101 | 12/1985 | (JP) | H01C/7/00 |
| 3216960 | * 9/1988 | (JP) | 204/192.21 |
| 8300256 | 1/1983 | (WO) . | |

OTHER PUBLICATIONS

Wolf et al., "Silicon processing for the VLSI Era, vol. 1, Process Technology.", Lattice Press, 1986, pp. 331–335.*
Wolf, "Silicon Processing for The VSLI Era", vol. 1 Process Technology, pp. 365–367, 1986.*
IBM Technical Disclosure Bulletin, vol. 24, No. 6, Nov. 1981 pp. 2962–2963.*
European Search Report and Annex, Application No. 89 11 2987.

* cited by examiner

*Primary Examiner*—Trung Dang
(74) *Attorney, Agent, or Firm*—Pillsbury Winthrop

(57) ABSTRACT

A semiconductor device having a thin film resistor which comprises at least chromium, silicon and nitrogen, and formed on a substrate with having a special ratio of the chemical composition, the semiconductor device having a characteristic such that variations of the resistance value thereof due to temperature variations can be effectively suppressed.

2 Claims, 20 Drawing Sheets

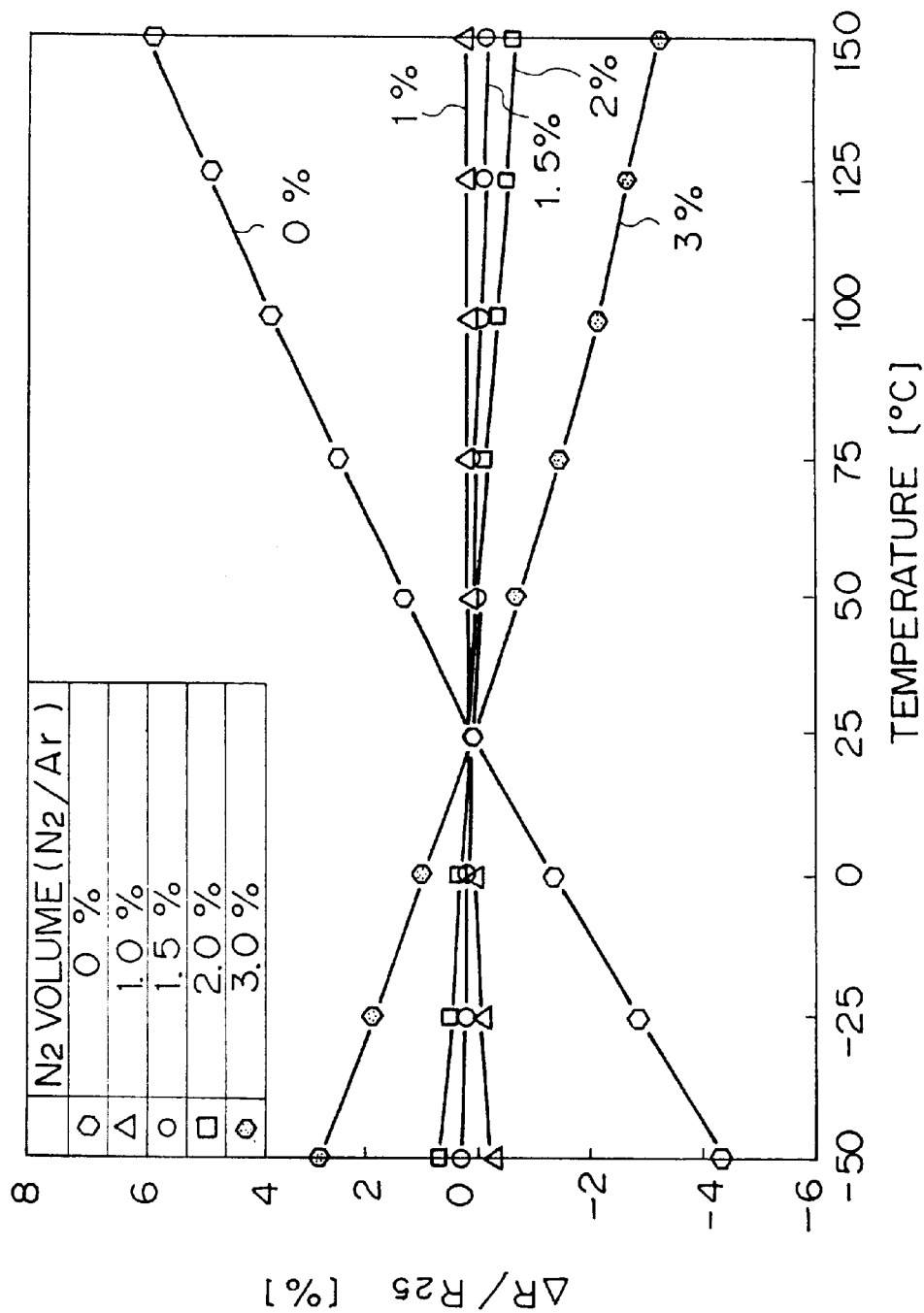

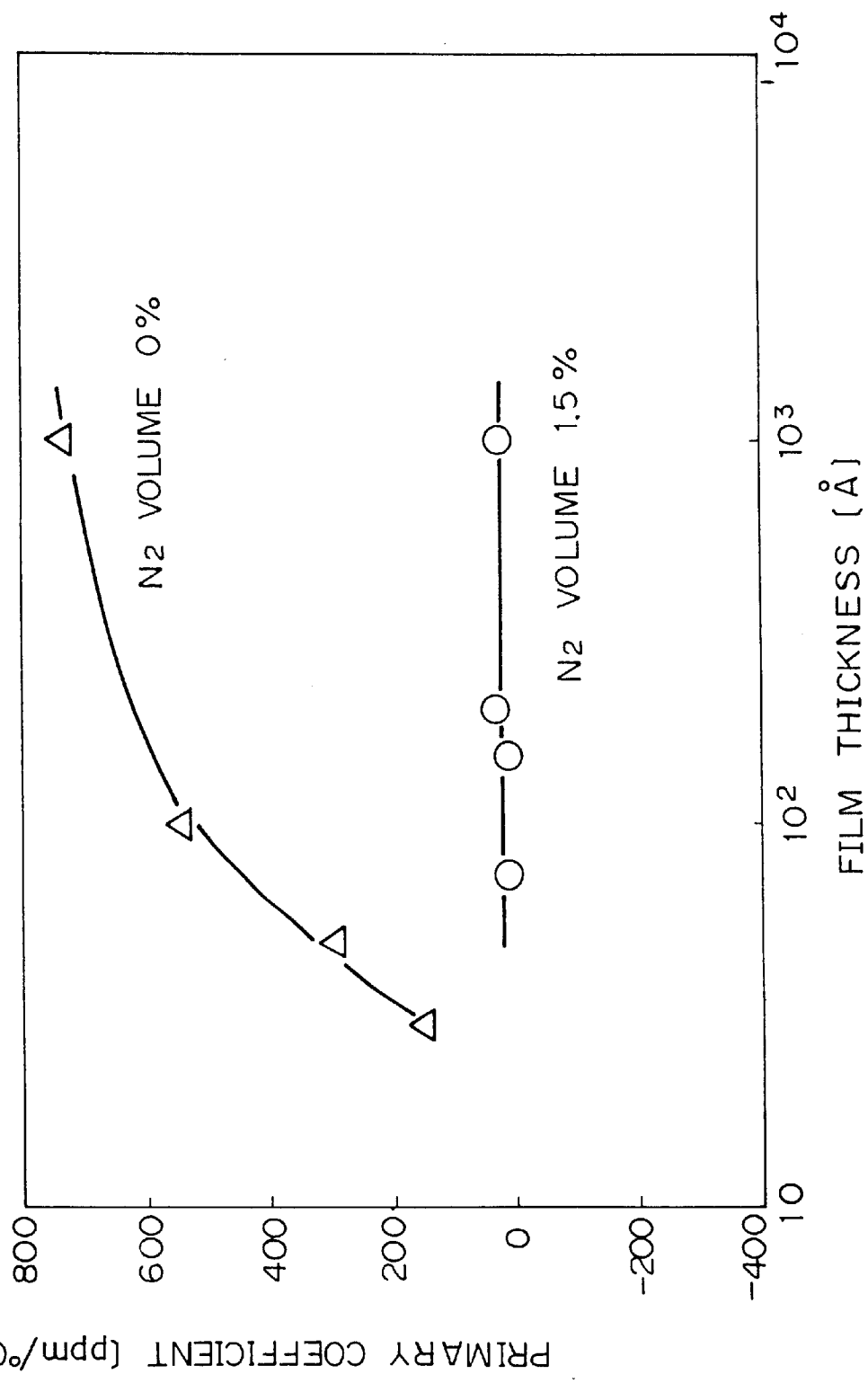

SEMICONDUCTOR DEVICE HAVING THIN FILM RESISTOR AND METHOD OF PRODUCING SAME

This is a continuation of application Ser. No. 07/680,011, filed on Apr. 2, 1991, which was abandoned upon the filing hereof which is a Continuation of Ser. No. 07/379,775, filed Jul. 14, 1989 abandoned.

BACKGROUND OF THE INVENTION

1. Field of the Invention

This invention relates to a semiconductor device having a thin film resistor integrated therein and a method of producing the same as a molded resin package.

2. Description of the Related Art

Conventionally, a thin film resistor is formed and integrated with an insulating component of an IC, LSI or the like, to be used as a resistor.

This thin film resistor is usually composed of chromium (Cr) and silicon (Si) because the temperature coefficient of the resistance (TCR) thereof is low, and therefore any variations of the resistance due to changes in the temperature thereof are small.

Also, the TCR of this kind of thin film resistor composed of Cr and Si can be further lowered by varying the ratio of the content of Cr and Si.

Nevertheless, this kind of thin film resistor has a disadvantage in that it is difficult to make the TCR zero, and in general, preferably the value of $\Delta R/R_{25}$, as shown in FIG. 7, is always zero even when the temperature is varied.

FIG. 7 shows the temperature dependency of the resistor value, and for the above purpose, a condition of a $\alpha=0$ and $\beta=0$ is required in the following equation obtained by the method of least squares.

$$\Delta R/R_{25} = \alpha(T-25) + \beta(T-25)^2$$

Wherein $R_{25}$ represents a resistance value at a temperature of 25° C., $\Delta R$ represents a variation of the value $(R_T-R_{25})$ of the resistance measured at the temperature T and $R_{25}$, $\alpha$ represents a primary coefficient, and $\beta$ represents a secondary coefficient.

As shown in FIG. 8, a problem arises in that the condition of $\alpha=0$ can be realized but another condition, i.e., $\beta=0$ cannot be simultaneously realized.

It is considered that the reason for the non-linearity of the graph shown in FIG. 7 is that, when the mobility $\mu$ becomes greater due to the existence of the microcrystal of the $CrSi_2$ in the thin film resistor composed of a Cr—Si compound, the effect of the lattice vibration caused by the change in temperature becomes remarkable, and thus the resistance represented by the following equation will be varied because variation of the $\mu$ becomes large as the temperature is raised.

$$\text{Resistivity} = \frac{1}{q \times \mu \times n}$$

SUMMARY OF THE INVENTION

The present invention is intended to overcome the above problems and the object of this invention is to provide a semiconductor device having a thin film resistor, wherein little change of the value of the resistance occurs despite variations of the temperature thereof, and to provide a method of producing same.

Therefore, according to the present invention there is provided a semiconductor device having a thin film resistor composed of chromium, silicon and nitrogen, formed on a substrate, the device being characterized in that the thin film resistor is amorphous and has the same energy band structure as that of metal.

Alternatively, the thin film resistor of the semiconductor device of the present invention is composed of chromium, silicon, nitrogen and oxygen, and is formed on a substrate, and is further characterized in that the thin film resistor has a chemical composition ratio (a ratio of the atomic number) of Cr=1, Si=2–2.5, N=0.3–1.5 and O=0.5–1.5.

In accordance with the present invention there is also provided a method of producing the above semiconductor device having a thin film resistor composed chromium, silicon and nitrogen formed on a substrate and characterized in that the thin film resistor forming process comprises the steps of preparing a target containing at least chromium and silicon, the weight percentage of the silicon to the total weight of the chromium and silicon, being 41 to 57 weight %, and carrying out a reactive sputtering of a substrate utilizing that target in an atmosphere of an inert gas containing 1–2% of nitrogen gas, and is further characterized in that a thermal history of said thin film resistor applied thereto, after the completion of the thin film resistor forming process and upto the completion of the final process thereof, is less than 500° C.

In this process, the target may also include nitrogen.

BRIEF DESCRIPTION OF THE DRAWINGS

FIG. 9 is a graph of a temperature dependence characteristic of a variation of the resistor value where a value of the nitrogen $N_2$ is varied while the sputtering operation is carried out when using a thin film resistor composed of Cr, Si and N at a ratio of Si/(Si+Cr) of 47.5 wt %;

FIG. 10(*b*) is a graph of a relationship between a volume of the $N_2$ where the sputtering operation is carried out and a secondary coefficient $\beta$ when using a Cr—Si—N thin film resistor formed from the CrSi target, the weight percentage of Si/(Si+Cr) being 47.5 wt %;

FIGS. 14(a) and 14(b) shown a relationship between the film thickness of the Cr—Si—N thin film resistor 80 and the value of the primary coefficient a or the secondary coefficient β, respectively;

DESCRIPTION OF THE PREFERRED EMBODIMENTS

The preferred embodiments of this invention will be explained with reference to the accompanying drawings.

FIGS. 1 to 6 illustrate the first embodiment of this invention.

Figure 1:
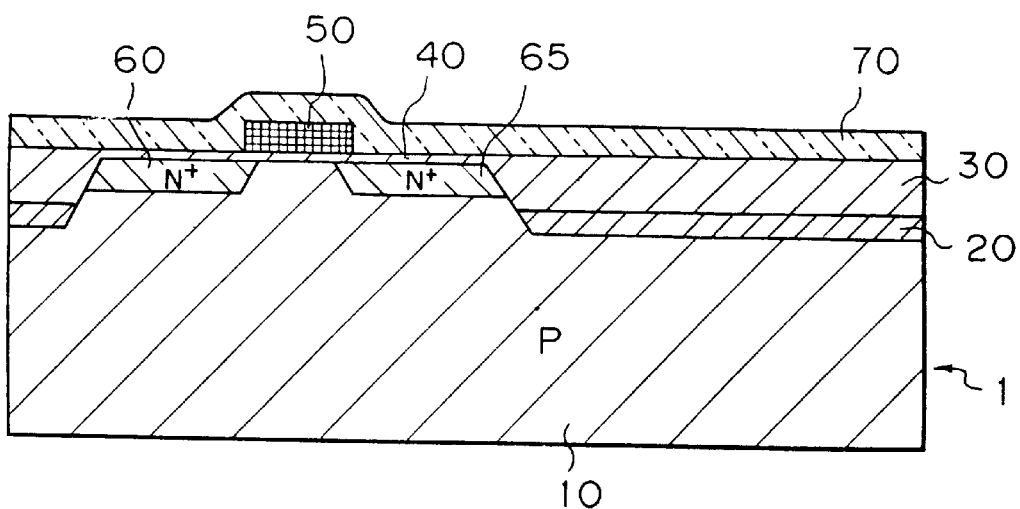
FIG. 1, and FIGS. 3 to 6 are cross sectional views illustrating a process of manufacturing one embodiment of the present invention.
Figure 2:
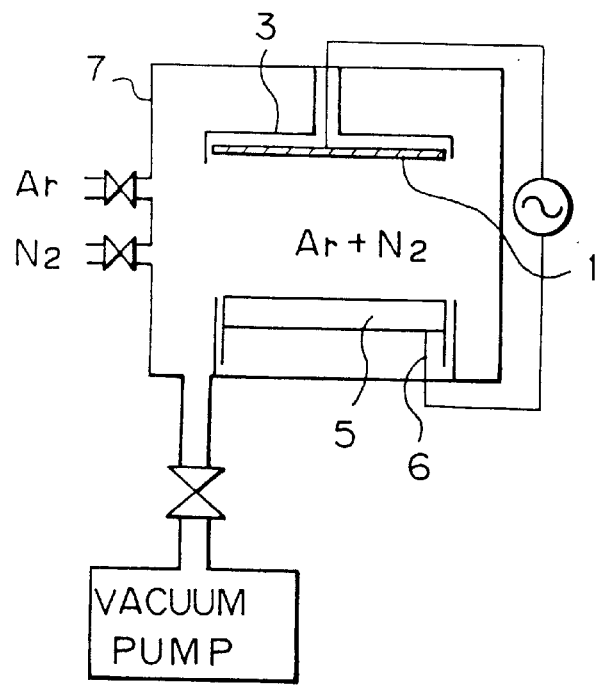
FIG. 2 is a schematic view of a sputtering device used for the embodiment shown in FIG. 1, and FIGS. 3 to 6.

As shown in FIG. 1, a P-type channel stopper 20, a LOCOS oxide layer 30, a gate oxide layer 40, a polycrystalline silicon gate layer 50, an N-type diffusion source layer 60, an N type diffusion drain layer 65, and a BPSG layer 70 are formed, in this order, on a P-type silicon semiconductor substrate 10 by a usual MOS process, and then the thus fabricated material is fixed to an electrode 3 of a substrate of the $N_2$ reactive sputtering device, as shown in FIG. 2.

Subsequently, a target 5 composed of Cr and Si, in which the weight percentage % of silicon to the total weight of chromium and silicon (Si/Si+Cr) is 49 wt %, is fixed to a target electrode 6 and they are both arranged in a sputtering device 7 and a reactive sputtering operation is carried out under the conditions of a wafer temperature of 300° C., a sputtering power of 50 W, a sputtering time of 10 minutes, an Ar flow rate of 20 cc, and an $N_2$ flow rate of 0.3 cc.

Note, the $N_2$ flow rate of 0.3 cc means that the ratio of $N_2$ to Ar (i.e., $N_2/Ar$) is 1.5%.

Figure 3:
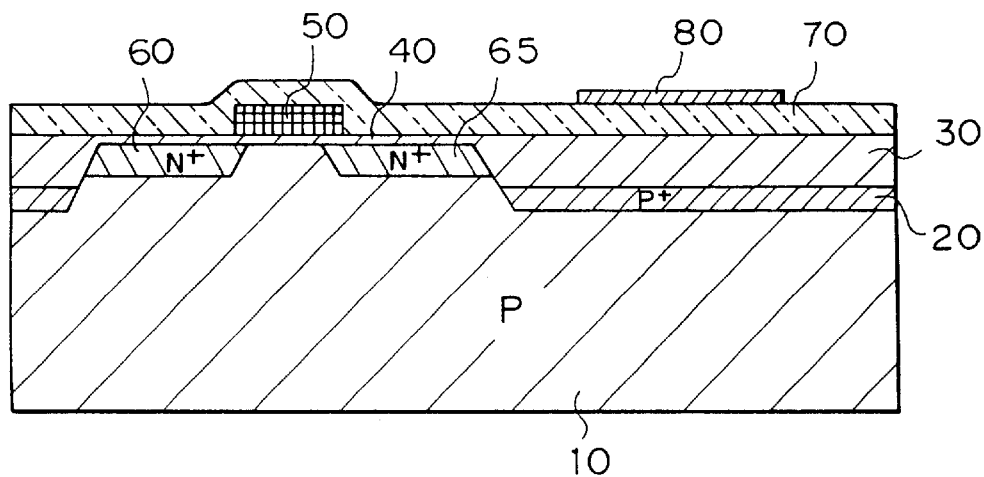

Then a thin film 80 composed of Cr, Si and N and having a thickness of 160 Å is formed on a surface of the fabricated body 1 using a CrSi target wherein the weight percentage of Si is 47.5 wt %, and a construction as shown in FIG. 3 is then-obtained by removing the Cr—Si—N thin film resistor by the lithography and photo-etching method, from a place other than the place on which a Cr—Si—N thin film resistor is finally provided.

Figure 4:
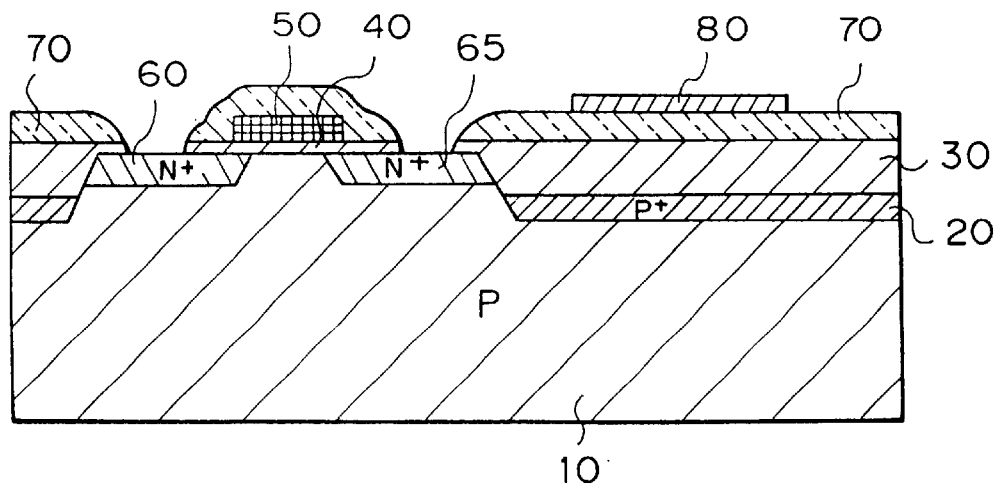
Figure 5:
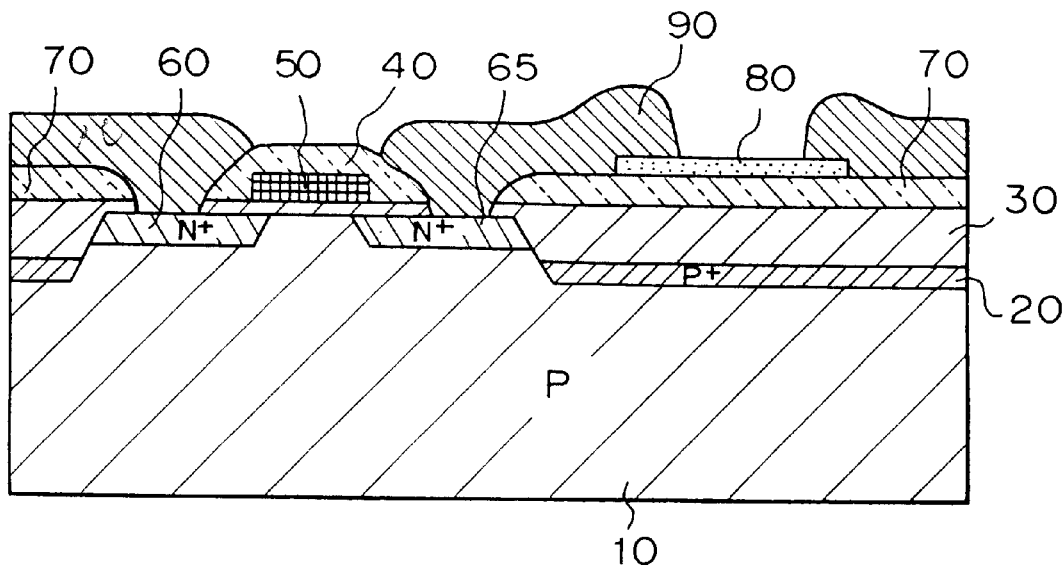
Figure 6:
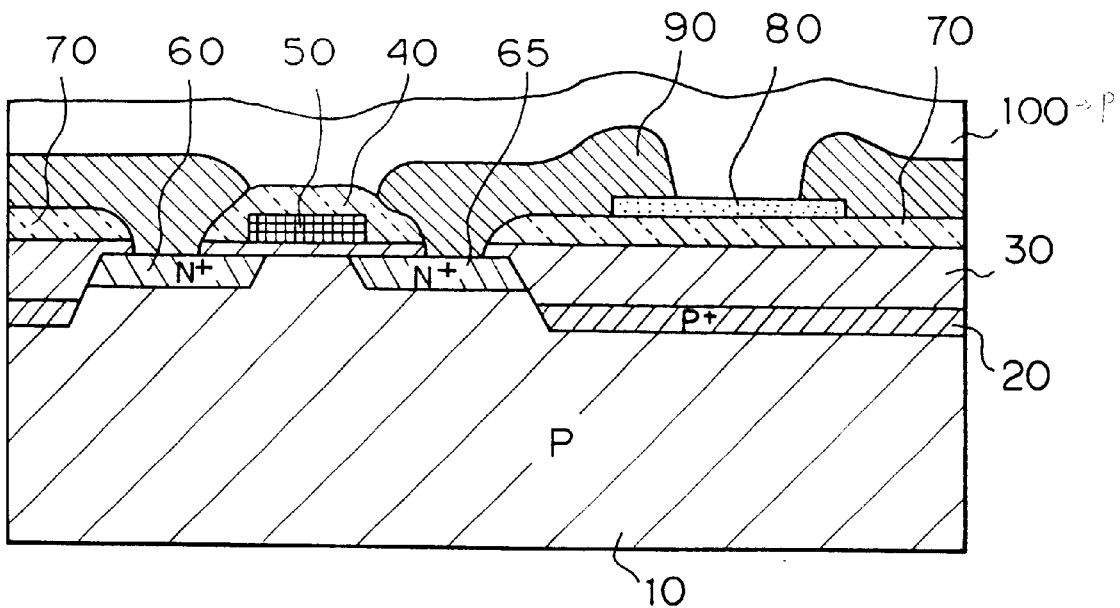
Figure 7:
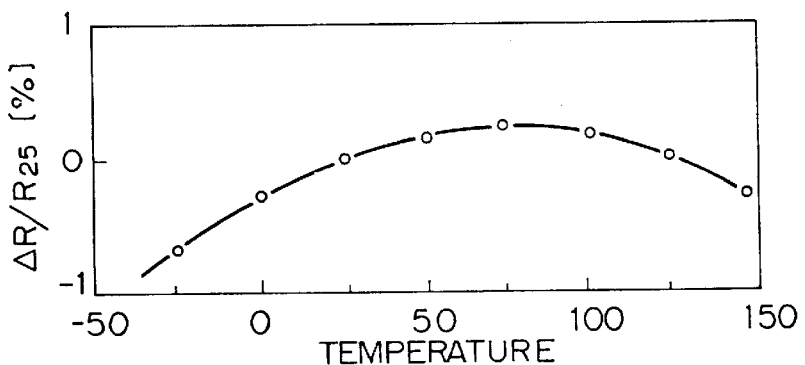
FIG. 7 is a graph of a temperature dependency of a variation of the resistor value when using a conventional thin film resistor composed of chromium (Cr) and silicon (Si)

Then, as shown in FIG. 4, the portions of a BPSG layer 70 corresponding to a source (N type diffusion layer) 60 and a drain (N type diffusion layer) 65 respectively, are removed by photo-etching to form openings, and thereafter, an aluminum wiring 90 is formed on the openings as shown in FIG. 5.

The process of forming the aluminum wiring 90 comprises the steps of depositing an aluminum film over the whole surface of the fabricated body 1 by sputtering, forming a predetermined pattern by photo-etching the aluminum film using an etchant consisting of phosphoric acid, sintering the formed pattern, under a gas stream of $H_2N_2$ ($H_2$ 10%) at a temperature of 450–500° C., depositing a plasma nitride film (P—SiN) 100 having a thickness of 1 μm over the whole surface thereof by a plasma CVD method at a temperature of 380° C., and providing an opening for a pad (not shown) by photo-etching the plasma nitride film.

Accordingly, a silicon gate type N-MOSLSI in which the Cr—Si—N thin film resistor is integrated is formed.

The results of an analysis of the Cr—Si—N thin film resistor obtained in this embodiment will be explained hereunder with reference to FIGS. 9, 10(a), 10(b), 11, 15, 16 and 17.

Note that the above analysis was carried out by utilizing an apparatus Model MLH-2306 produced by the ULVAC JAPAN Ltd. as the sputtering system.

FIG. 9 is a graph of a temperature dependency of a variation of the resistor value where a volume of the nitrogen $N_2$ is varied when the sputtering operation is carried out, when using a Cr—Si—N thin film resistor formed from the CrSi target; the weight percentage of Si/(Si+Cr) being 47.5 wt %.

Figure 10A:
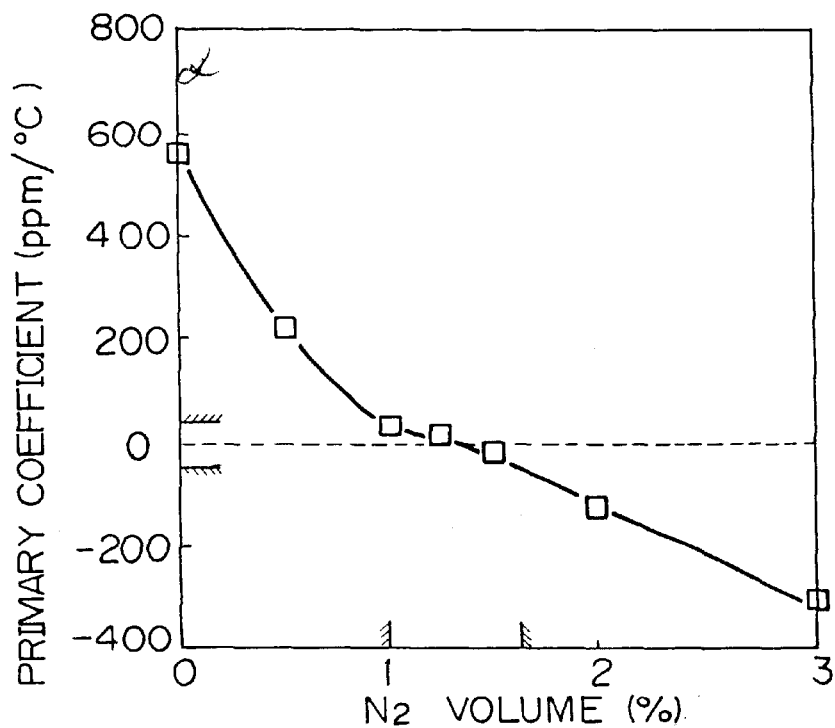
FIG. 10(*a*) is a graph of a relationship between a value of the $N_2$ where the sputtering operation is carried out and a primary coefficient $\alpha$ when using a Cr—Si—N thin film resistor utilizing a CrSi target having a composition ratio of Si/(Si+Cr) of 47.5 wt %.

FIG. 10(a) is a graph of a relationship between a volume of the nitrogen $N_2$ where the sputtering operation is carried out and a primary coefficient a when using a Cr—Si—N thin film resistor formed from the CrSi target; the weight percentage of Si/(Si+Cr) being 47.5 wt %.

Figure 10B:
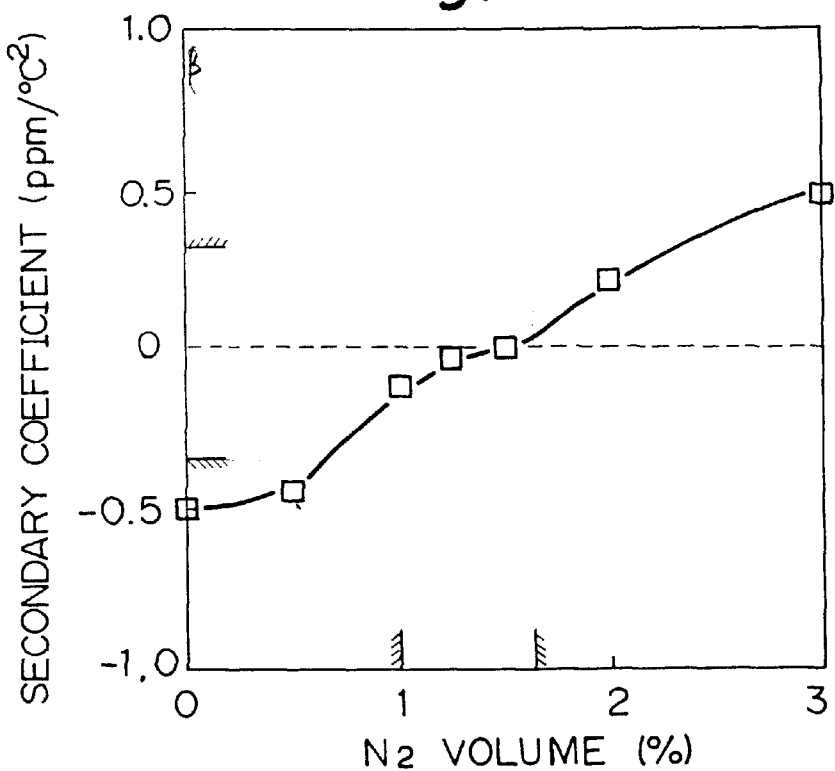

FIG. 10(b) is a graph of a relationship between a volume of the nitrogen $N_2$ where the sputtering operation is carried out and a secondary coefficient β when using a Cr—Si—N thin film resistor formed from the CrSi target, the weight percentage of Si/(Si+Cr) being 47.5 wt %.

Figure 11:
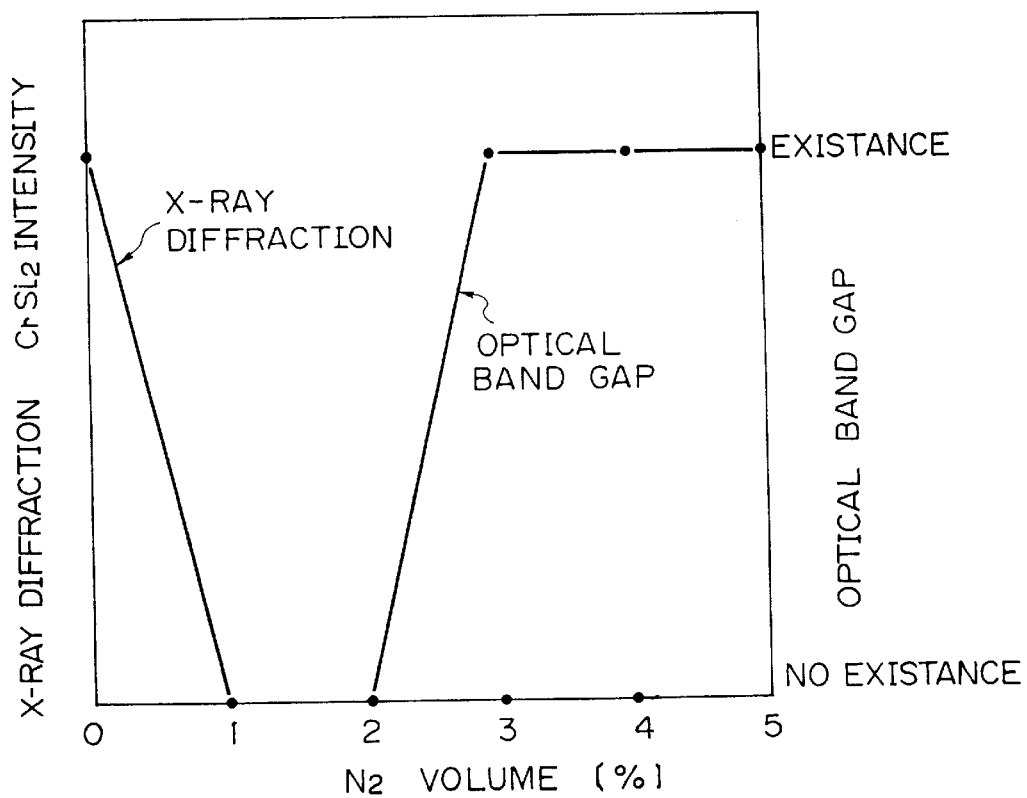
FIG. 11 is a graph of a degree of crystallization and a generation of an optical band gap where a volume of the nitrogen $N_2$ is varied when the sputtering operation is carried out when using a Cr—Si—N thin film resistor utilizing the CrSi target, the weight percentage of Si/(Si+Cr) being 47.5 wt %.
Figure 8:
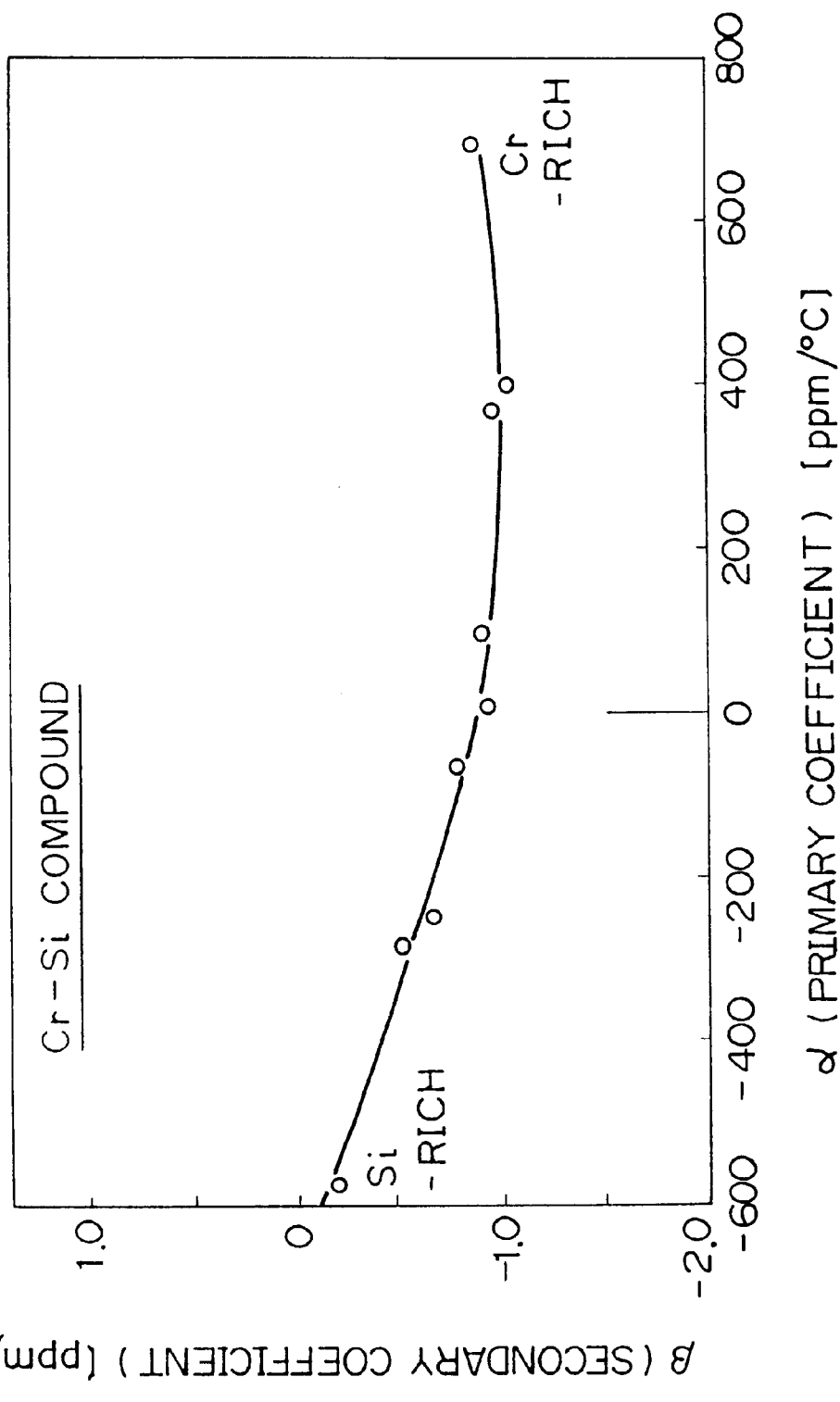
FIG. 8 is a graph of a relationship between the primary coefficient $\alpha$ and the secondary coefficient $\beta$ when the ratio of Cr and Si is varied when using a conventional thin film resistor composed of Cr and Si.

FIG. 11 is a graph of a degree of crystallization and a generation of an optical band gap when a volume of the nitrogen $N_2$ is varied where the sputtering operation is carried out when using a Cr—Si—N thin film resistor formed from the CrSi target; the weight percentage of Si/(Si+Cr) being 47.5 wt %.

Note, the optical band gap is measured in order to examine the construction of the energy band of the Cr—Si—N thin film resistor.

As shown in FIG. 9, when the additional volume of $N_2$ during the sputtering operation is from 1–2%, the variation of the value of the resistor is small despite variations of the temperature, and when the Cr—Si—N thin film resistor (the $N_2$ value during the sputtering is ($N_2/Ar$)=1.5%) is used, the variation of the resistor value due to temperature variations is substantially zero.

As shown in FIG. 9, the variation of the value of the resistor due to temperature variations during the sputtering when the $N_2$ volume is 3% is larger than when the $N_2$ volume during the sputtering operation is from 1–2%.

This is because a higher volume of $N_2$ caused the generation of an as shown in FIG. 11, which gives the resistor the same characteristics as a semiconductor, thereby a variation of carrier density n due to a temperature variation will be generated and therefore, when the value n in the above equation;

$$\text{Resistivity} = \frac{1}{q \times \mu \times n}$$

is varied due to variations of the temperature, the value of the resistance is also varied.

Therefore, the upper limit to the amount of additional $N_2$ is a value such that the optical band gap is not generated in the thin film resistor i.e., a value at which the thin film resistor has the same characteristics as a metal.

As shown in FIG. 11, when the $N_2$ volume is changed from 0 to 1%, the intensity of X ray diffraction of the microcrystal of $CrSi_2$ in the Cr—Si—N thin film resistor, is reduced as the $N_2$ volume is increased.

Further, when the value of $N_2$ is 1–2%, the diffraction peak measured by X ray diffraction is not generated.

Figure 15A:
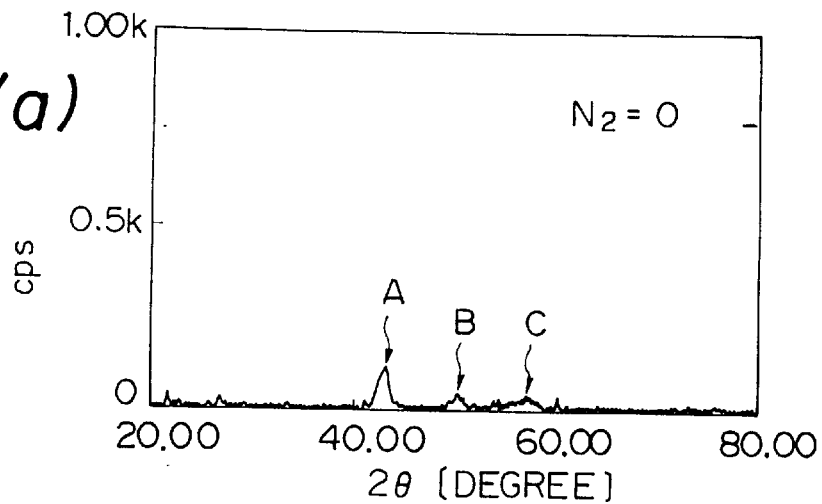
FIGS. 15(a), 15(b) and 15(c) show a graph obtained by plotting the results of X-ray diffraction.
Figure 15B:
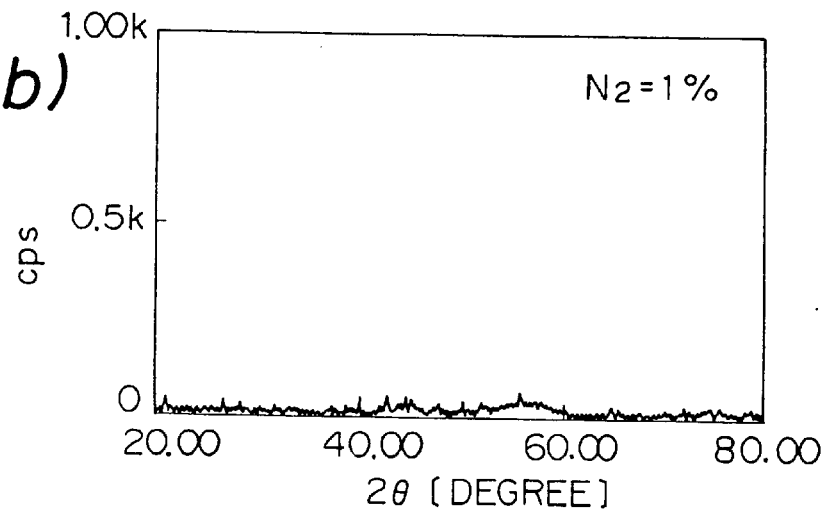
Figure 15C:
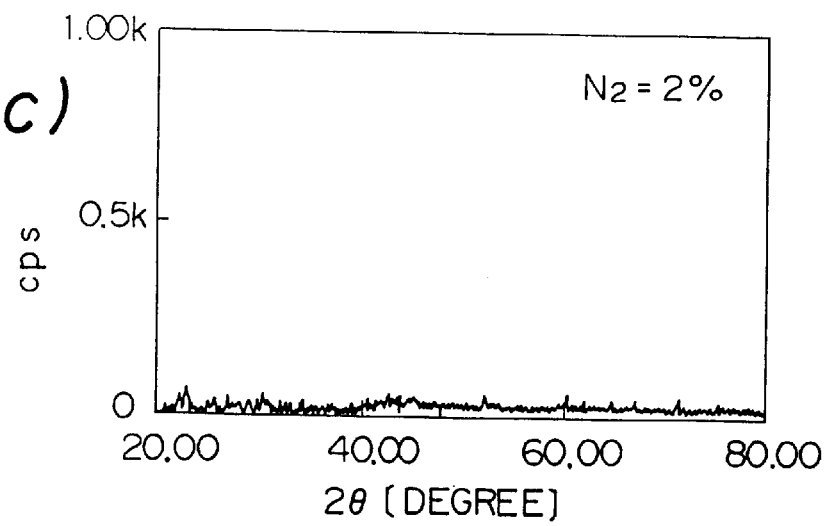

FIG. 15 shows the results of the X ray diffraction, wherein FIG. 15(a) shows the case in which $N_2$ is not added, FIG. 15(b) show the case in which 1% of $N_2$ is added, and FIG. 15(c) shows the case in which 2% of $N_2$ is added.

As shown in these Figures, when N2 is not added the peaks indicating the existance of the microcrystal of $CrSi_2$ therein, appear at the three respective points A, B and C, but when $N_2$ is added, no peak appears.

This means that, when the $N_2$ volume is increased, the degree of microcrystallization of $CrSi_2$ in the Cr—Si—N thin film resistor, is reduced, and thus the Cr—Si—N thin film resistor becomes amorphous.

But, when the $N_2$ volume is excessive, an undesirable optical band gap is generated as explained above.

Figure 16:
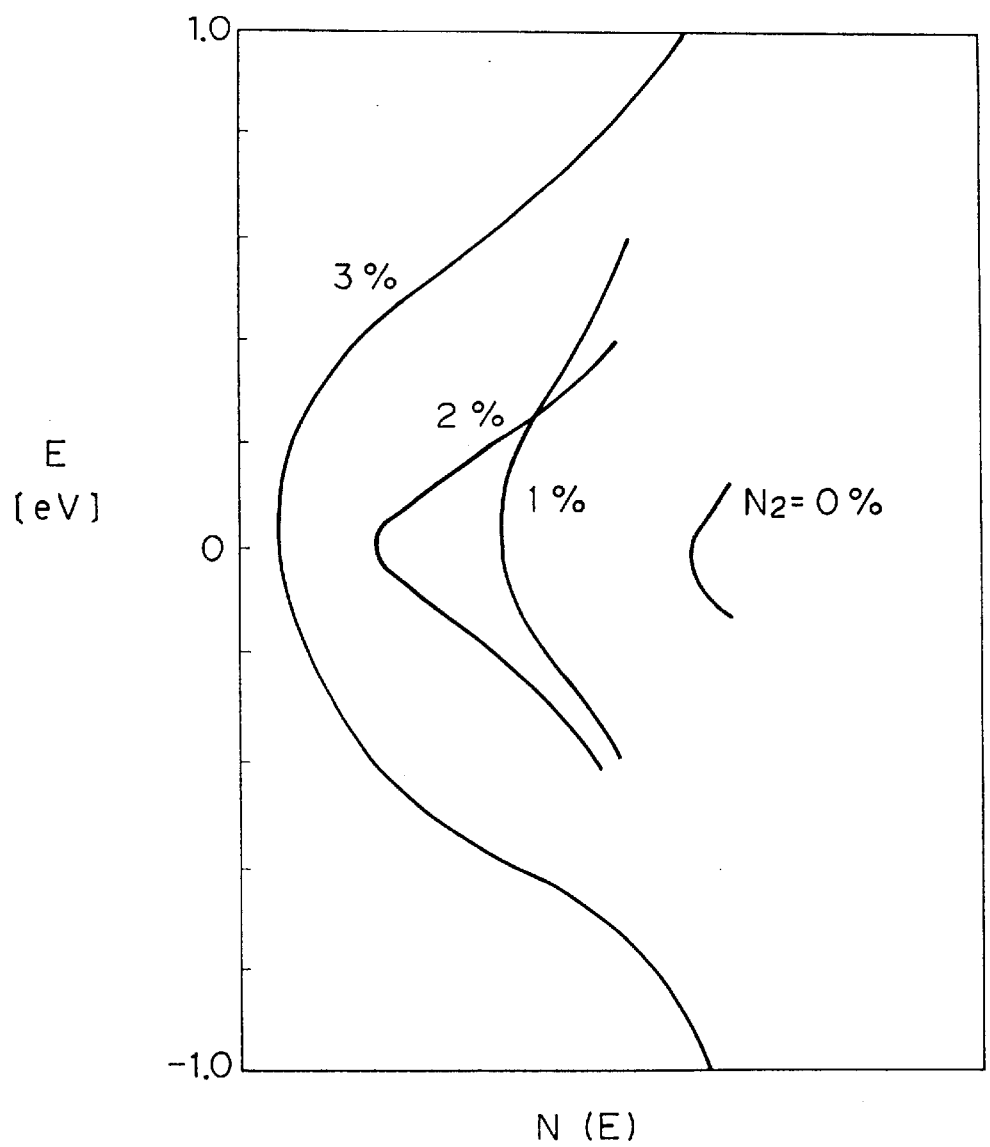
FIG. 16 shows an energy band gap of the Cr—Si—N thin film resistor.

FIG. 16 shows the results obtained when the energy band construction of the Cr—Si—N thin film resistor was analysed by a tunnel spectroscopy utilizing a tunnel current measurement method.

As shown in FIG. 16, when the $N_2$ volume is 0%, a densities of states N(E) is not reduced at an energy E=0 eV and when the $N_2$ volume is 3%, a densities of states N(E) is reduced and indicates that an energy band gap has been formed.

These results are the same as the results obtained by the optical band gap measuring method.

It is considered that characteristics of the energy band of the Cr—Si—N thin film resistor will change from those of a metal to those of a semiconductor as the $N_2$ volume is increased.

Namely, as understood from the results obtained by the optical band gap measuring method and the densities of states N(E) measuring method, the $N_2$ volume should be such that an energy band gap of the Cr—Si—N thin film resistor is not generated.

When the $N_2$ volume is within the above range, the Cr—Si—N thin film resistor has the characteristics of a metal in which the carrier density thereof is not change by variations of the temperature.

As apparent from FIGS. 10(a) and 10(b), when the $N_2$ volume during the sputtering is varied, the primary coefficient α and a secondary coefficient β can be made zero, and in this embodiment, when the $N_2$ volume is 1.5%, the coefficients α and β can be made approximately zero, and therefore, the resistance value of the Cr—Si—N thin film resistor undergoes little change even when the temperature is varied as shown in FIG. 9.

Figure 12:
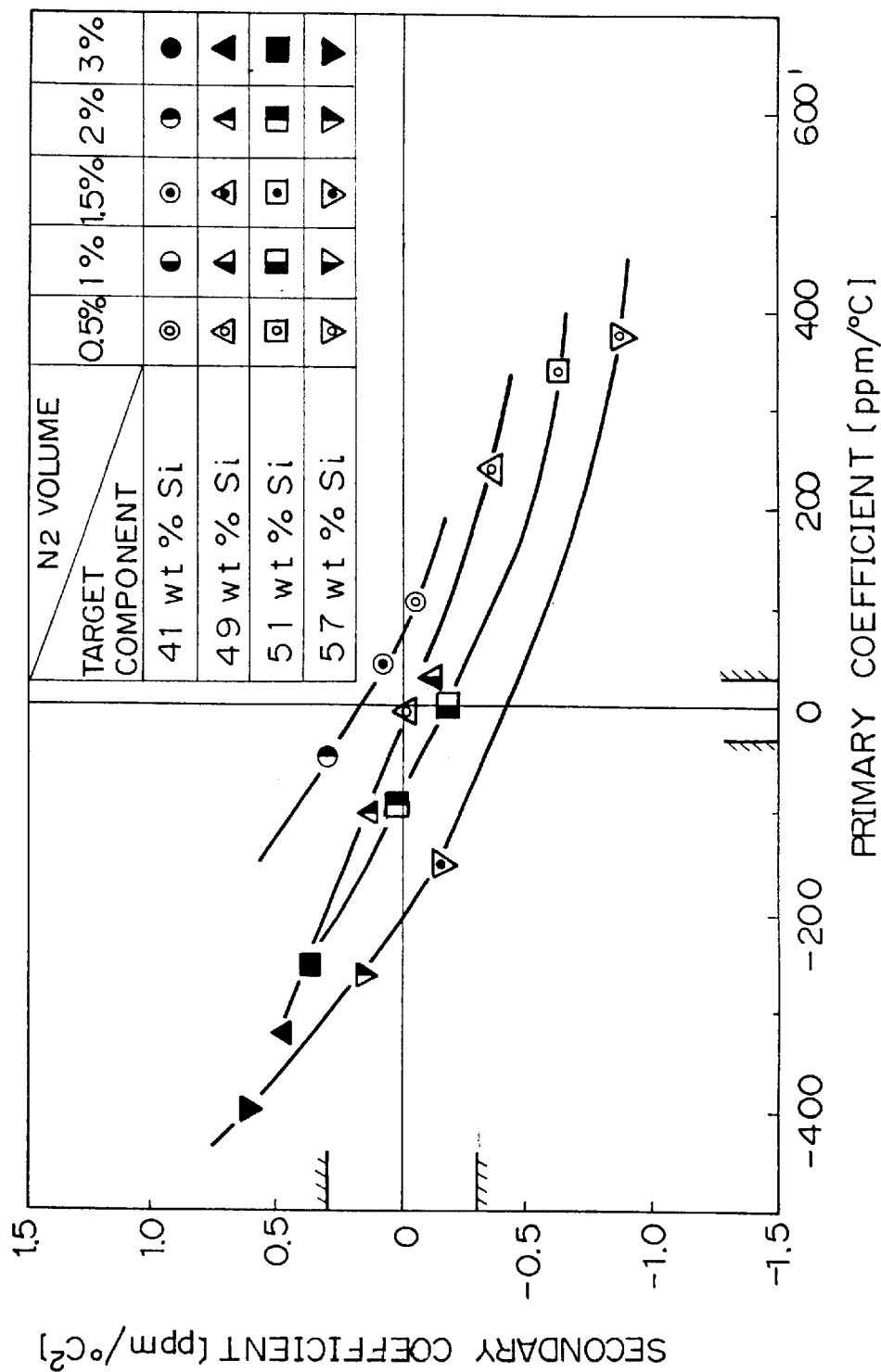
FIG. 12 shows a resistance-temperature characteristic when the composition of the target and the added volume of $N_2$ are varied.

FIG. 12 shows a resistance-temperature characteristic when the composition of the target and the additional $N_2$ volume are varied.

As shown in FIG. 12, the values of the primary coefficient α and the secondary coefficient β are close to zero when the silicon weight percentage is 41–57 wt % and the additional $N_2$ volume is 1–2%, and thus the temperature coefficient of the resistance (TCR) is close the zero.

Figure 13:
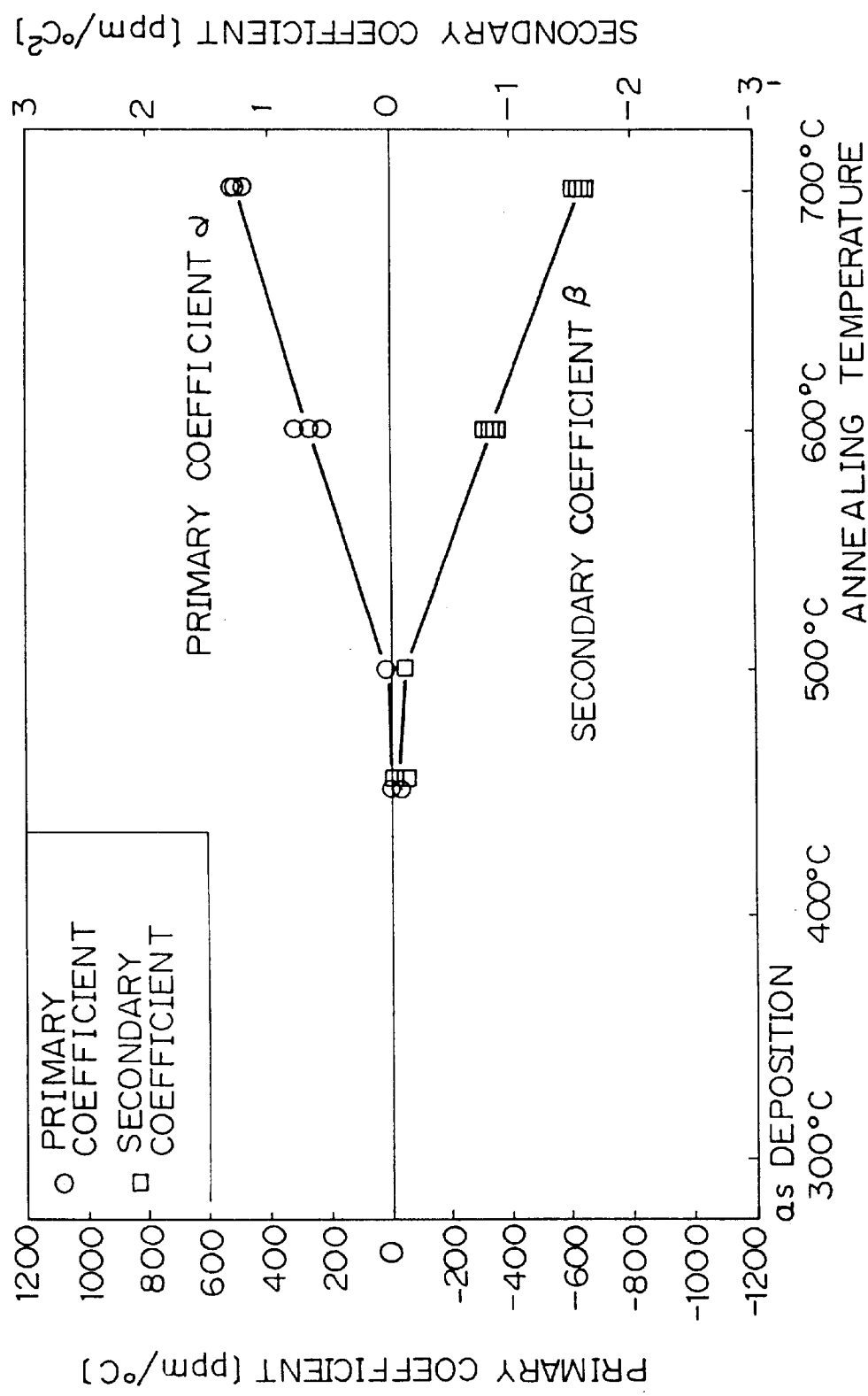
FIG. 13 shows a resistance-temperature characteristic when the annealing temperature is varied.

FIG. 13 shows a resistance-temperature characteristic depending upon variations of the annealing temperature applied to the thin film resistor after the forming, thereof.

As shown in FIG. 13, the values of the primary coefficient α and the secondary coefficient β are close to zero when the annealing temperature is lower than 500° C., and when the annealing temperature is higher than 500° C., the value of the primary coefficient α is gradually raised and the value of the secondary coefficient β is gradually lowered.

The reason why the values of the primary coefficient α and secondary coefficient β are changed is considered to be that, when the annealing temperature is higher than 500° C., crystallization of the $CrSi_2$ in the thin film resistor occurs and thus the thin film resistor is no longer amorphous.

According to this embodiment, as explained above, since the thermal history applied to the thin film resistor from when the thin film resistor is formed to when the final process is carried out is lower than 500° C., the values of the primary coefficient α and the secondary coefficient β are not changed.

Figure 14B:
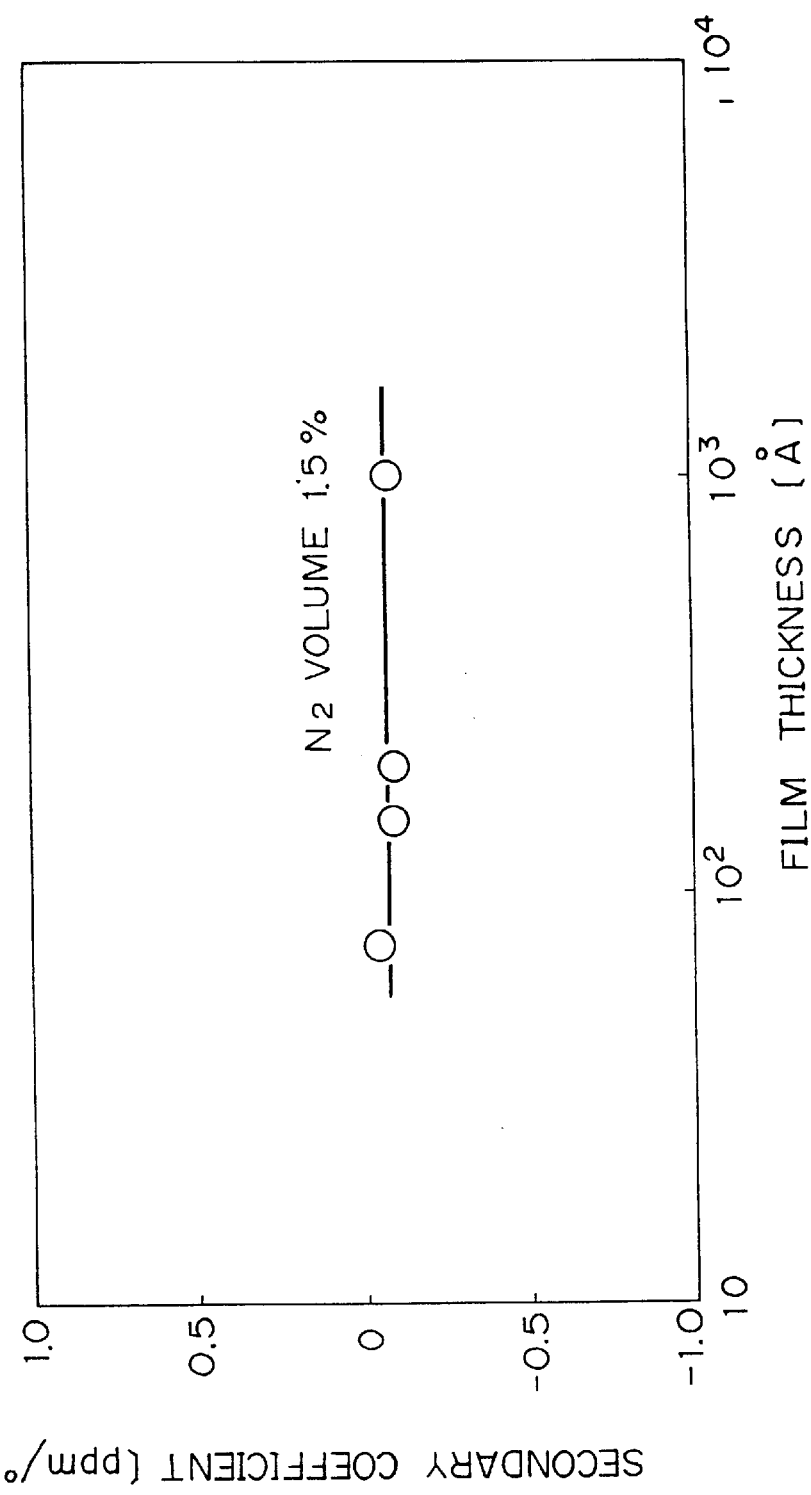

FIGS. 14(a) shows relationship between the film thickness of the Cr—Si—N thin film resistor 80 and the value of the primary coefficient α with respect to the $N_2$ value as a parameter, and FIG. 14(b) shows a relationship between the film thickness of the Cr—Si—N thin film resistor 80 and the secondary coefficient β when the $N_2$ value is constant.

In these Figures, the curve having a circle symbol shows the characteristic when 1.5% of $N_2$ is added and the curve having a triangle shows the characteristic when $N_2$ is not added.

As shown in these Figures, when $N_2$ is added according to the present invention, the TCR does not depend upon the thickness of the film, and thus a desired resistance value can be easily obtained by adjusting the thickness of the film.

Further, since the TCR does not change even when variations of the thickness of the film occur during the manufacturing process, the thin film resistor of the present invention is easily produced.

Figure 17:
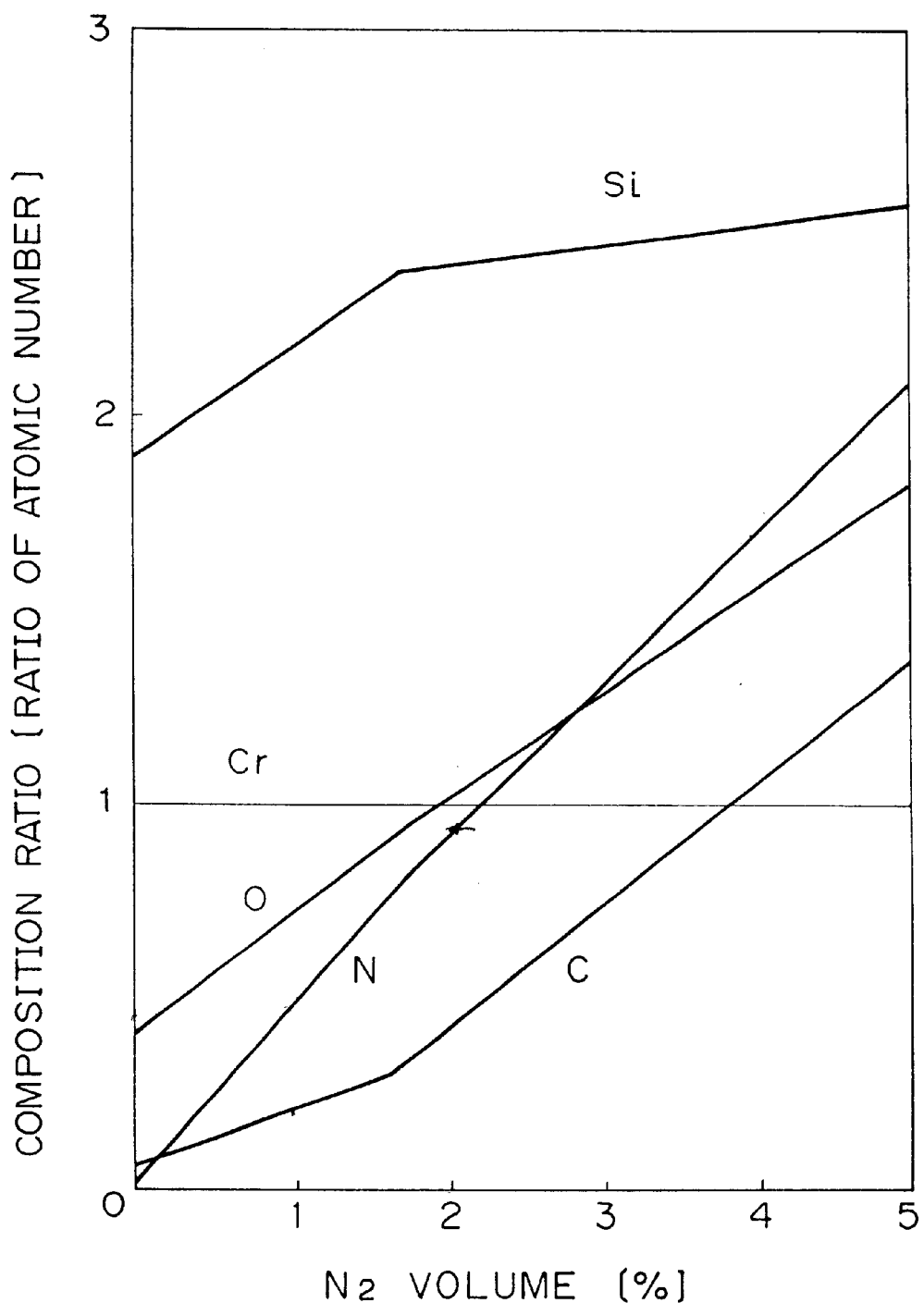
FIG. 17 shows a relationship between the composition ratio and the volume of $N_2$.

FIG. 17 shows the results of a component analysis of the Cr—Si—N thin film resistor of this embodiment, utilizing an XPS analyzer, wherein the component ratio is indicated as the ratio of the atomic number when the atomic number of Cr is assumed to be 1. In FIG. 17, the thin film to be analyzed was produced in such a way that Cr—Si—N film having a thickness of 1000 Å is formed on a substrate and then it was heat treated in a gas stream of $H_2N_2$ at a temperature of 450° C. for 30 minutes. Thereafter the thickness of the film was reduced to 200 Å by etching operation with a sputtering method utilizing a device such as ESCALAB-5 produced by VG Co. Then the surface of it is provided to the analysis.

As shown in FIG. 17, when the $N_2$ volume is increased during the $N_2$ reactive sputtering, the composition ratio of nitrogen N in the thin film is also increased, and further, as the volume of nitrogen is increased, the volumes of oxygen and carbon are also increased.

Oxygen is naturally taken into the film during the sputtering to form a network of Si—N—O, and therefore, the volume of oxygen will be increased as the volume of nitrogen is increased.

Accordingly, as a component of the Cr—Si—N thin film resistor, the volume of chromium, silicon, nitrogen, and oxygen must be controlled.

When the atomic number of Cr is represented as 1 and the composition ratio of Cr, Si, N and O are controlled, for example, Cr=1, Si=2–2.5, N=0.3–1.5 and O=0.5–1.5, a thin film resistor in which the resistance characteristic has a low temperature dependency is obtained.

Note, when the atomic number of Cr is represented as 1, carbon may be included therein at a composition ratio of C=0–1.

Also, in this embodiment, an $N_2$ reactive sputtering method is used for producing the Cr—Si—N thin film resistor, but other methods may be used as long as they are within the scope of the present invention.

For example, a Cr—Si—N thin film resistor having a thickness of 30–1000 Å wherein the weight percentage of Si is 30–70 wt % may be formed by a conventional sputtering method using a CrSiN target containing N at a weight percentage of 0.1–20 wt %. In this case, the composition of the target used in the sputtering process, should have a composition such that the thin film resistor becomes amorphous and has the same energy band construction as that of metal for example, chromium silicide.

Further, when the atomic number of Cr is represented as 1, the composition ratio of the thus-formed thin film resistor may be, for example, Cr=1, Si=2–2.5, N=0.3–1.5 and O=0.5–1.5.

In this embodiment, the film thickness of the Cr—Si—N thin film resistor is set at 160 Å but this thickness is not restricted and may be 30–1000 Å as mentioned above, and further although the weight percentage of Si in the CrSi target is set at 47.5 wt %, it may be set at 41–57 wt % as shown in FIG. 2.

This embodiment of the present invention is applied to an NMOS process, but can be applied to any other process as long as Cr—Si—N thin film resistor can be used and it can be applied to a CMOS process, bi-MOS process, bi-polar IC process or the like.

Further, in this embodiment the Cr—Si—N thin film resistor is formed on the surface of a BPSG film, but this resistor may be formed on a surface of an insulating portion such as an $SiO_2$ film, PSG film, $Si_3N_4$ film or the like. Also, the thin film resistor of the present invention can be used alone as a resistor device chip for a resistor array.

A semiconductor device in which a linear integrated circuit includes resistors on a chip is known, and a method in which a linear IC chip is packaged by a resin molding process is now in use.

In this type of device, however, a problem has been arisen in that the resistance is easily changed by a variation of a stress occurring during the resin molding operation, and thus it is considered difficult to obtain a high accuracy of an analog characteristic thereof in one chip.

Namely, when packaging process is carried out, a resistance value of a polycrystalline silicon or diffusion resistance ($P^+$) is varied due to the effect of the stress of the resin molding, and at the same time, is varied by variations of the stress applied to the IC chip due to a variation of a temperature coursed by variations of an atmospheric temperature thereof or a heat generation thereof.

Therefore, when a linear IC, which requires a high accuracy since it is used as a 5 V power source IC in automobiles without adjustment, is produced, the resistors are usually mounted thereon by arranging them outside the package, whereby the number of terminals of the IC, the electric devices mounted externally of the package, the steps for assembling those devices on the package, and the area of the substrate occupied by those devices are increased, which greatly increases production costs.

Therefore, there is a need for a method of providing a semiconductor in which a variation of the resistance caused by a variation of a stress applied to the IC chip due to a variation of the temperature, can be effectively suppressed.

An embodiment of a semiconductor device which is used as a 5 V power source IC in an automobile, without adjustment, will be explained with reference to the drawings.

Figure 19:
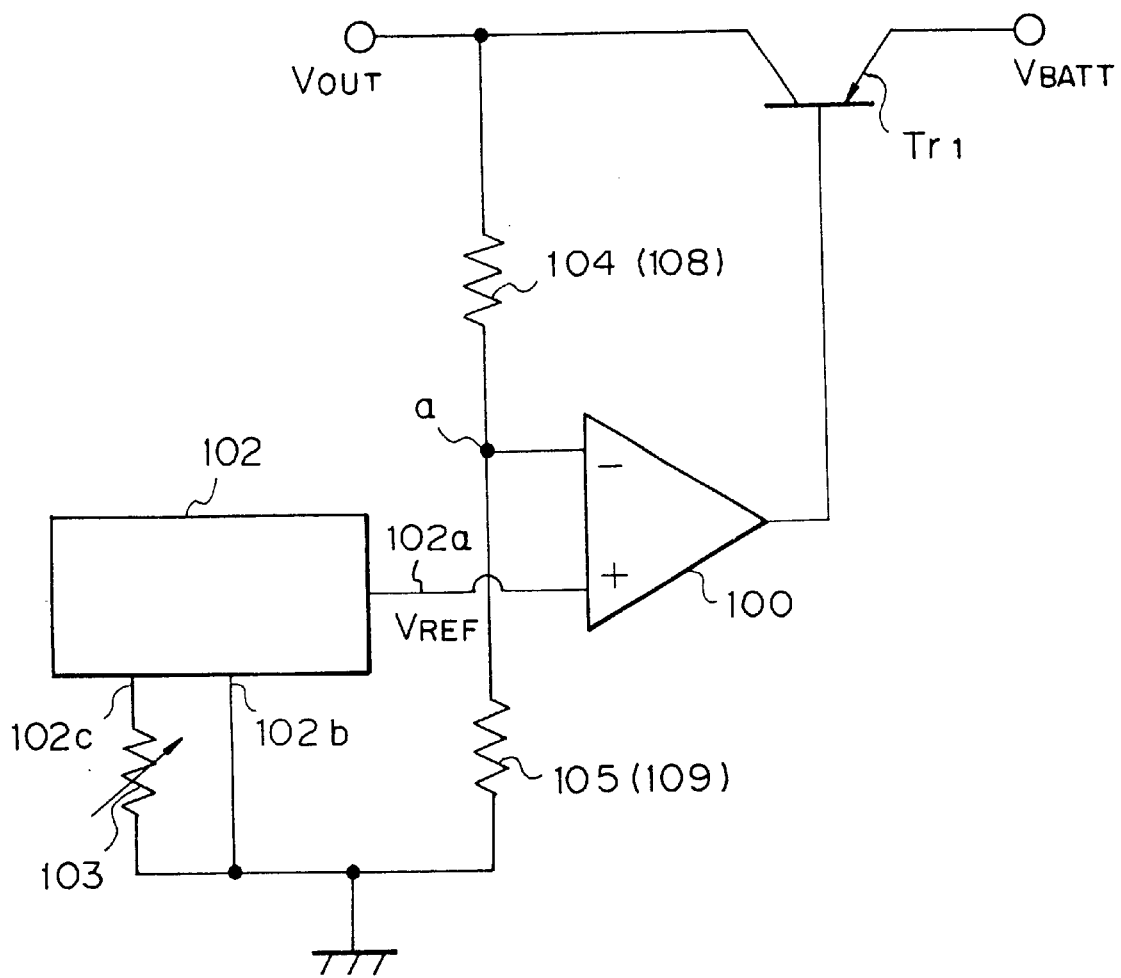
FIG. 19 shows an electrical circuit used in the resin molded IC package of one embodiment of this invention.

FIG. 19 shows an electric circuit for a constant voltage generating portion of the 5 V power source IC used for an automobile, without adjustment, which is required to maintain the voltage with a high accuracy at 5±0.025 V (0.5%).

In this IC, an output voltage is adjusted by a thin film trimmed on a chip, i.e., a thin film resistor as mentioned above.

As shown in FIG. 19, a battery voltage $V_{BATT}$ is applied to an emitter terminal of a PNP transistor Tr1, and a constant output voltage is output from a collector terminal of the PNP transistor Tr1.

An output of a differential amplifier 100 is connected to a base terminal of the PNP transistor Tr1, and the non-inverting input terminal thereof is connected to a terminal 102a of a band gap reference voltage generating portion 102.

A terminal 102b of the band gap reference voltage generating portion 102 is connected to the earth, and another terminal 102c is also connected to the earth through a thin film resistor 103 including at least Cr and Si, for adjusting the reference voltage.

Any kind of thin film resistor of the present this invention can be used as this thin film resistor after suitable modification, and further, by trimming this thin film resistor 103, for example, a Cr—Si—N thin film resistor, to change the value there of, the band gap reference voltage Vref output from the terminal 102a of the band gap reference voltage generating portion 102 can be adjusted.

The collector terminal of the PNP transistor Tr1 is connected to the earth through resistors R4 and R5 connected in series, and a node portion formed between the resistors R4 and R5 is connected to an inverting input terminal of the differential amplifier 100.

These resistors R4 and R5 are used for amplifying the band gap reference voltage generating Vref.

The constant output voltage Vout is represented by the following equation;

$$Vout = (Vref + VIO) \times \frac{r1 + r2}{r1}$$

Wherein Vref denotes a band gap reference voltage, VIO denotes an offset voltage of the differential amplifier 100, r1 denotes a value of the resistor 105, and r2 denotes a value of the resistor 104.

Accordingly, when a constant output voltage Vout=5 V is required, the following conditions, for example, Vref+VIO= 1.25 V and (r1+r2)/r1=4, should be satisfied.

Before the molded resin packaging process, the band gap reference voltage Vref is adjusted by trimming the thin film resistor 103 (trim resistor) by a laser trimming method, to provide an output voltage Vout of 5 V.

Namely, in this embodiment, even when the initial values of Vref, VIO, r1, and r2 are varied respectively, the output voltage Vout can be set precisely at 5 V.

In this embodiment, a Cr—Si—N thin film resistor or a Cr—Si—N—O thin film resistor, as explained above, is used for the resistors 104 and 105.

Figure 18:
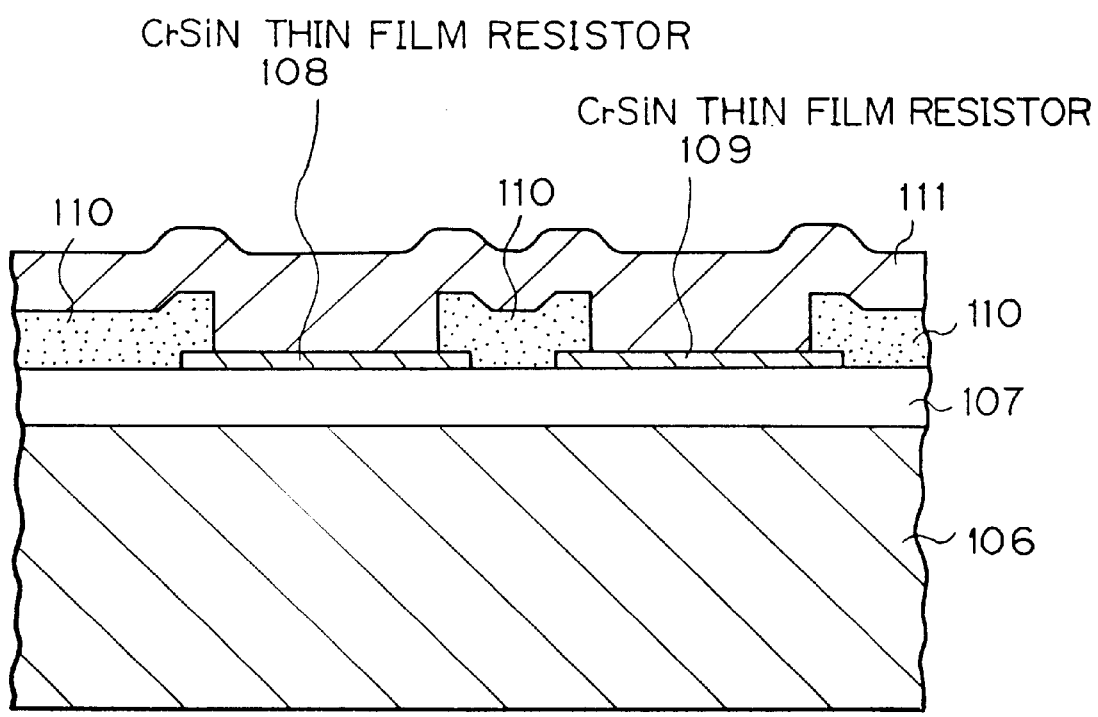
FIG. 18 shows a practical cross sectional view of the resin molded IC package of one embodiment of this invention.

FIG. 18 shows an arrangement of the resistor 104 and 105 in an IC chip, wherein an insulation film ($SiO_2$) 107 is deposited on a surface of a silicon substrate 106 and Cr—Si thin film resistors or Cr—Si—N thin film resistors 108 and 109 are provided on the surface of the insulation film 107 by a sputtering method. The thin film resistors 108 and 109 are electrically connected to an aluminum wiring 110.

Further, there is provided a surface protection film 111 covering the surface of the thin film resistors 108 and 109 and the aluminum wiring 110 and the surface of the protection film 111 is covered with a molding resin, and after the resistor (trim resistor) is trimmed, a packaging process for packaging the IC chip with a molding resin is carried out.

More precisely, after the IC chip is adhered to a chip mounting portion of a lead frame with a suitable adhesive (die bonding), a bonding pad provided on the chip is connected to the lead frame and then the packaging process is carried out.

In the packaging process utilizing a resin molding method, when a polysiloxane or a diffusion resistor is used in accordance with a conventional method, the value of the resistance of the IC package after the packaging operation is completed is remarkably different from the initial value thereof before the packaging process is carried out, due to the influence of the stress generated by an adhesive, fixing the lead frame and the IC chip, curing, or the stress generated by the molding resin. Therefore, the output voltage Vout is entirely different.

When the output voltage Vout is measured in such a way that a diffusion resistor (P$^+$) is used as the resistors 104 and 105 and the output voltage of the IC is adjusted to 5±0.001 V, then the IC chip is packaged by a resin molding method, and thereafter, the molded chip is measured the output voltage thereof remarkably varied in the range of 5±0.035 V (0.7%).

In comparison, in the present invention, when Cr—Si—N thin film resistors 108 and 109 are used as the resistors 104 and 105, a film thickness of 30–1000 Å can be obtained, and the output voltage after the molded resin packaging is completed can be set to 5±0.0075 V (0.15%).

Figure 20:
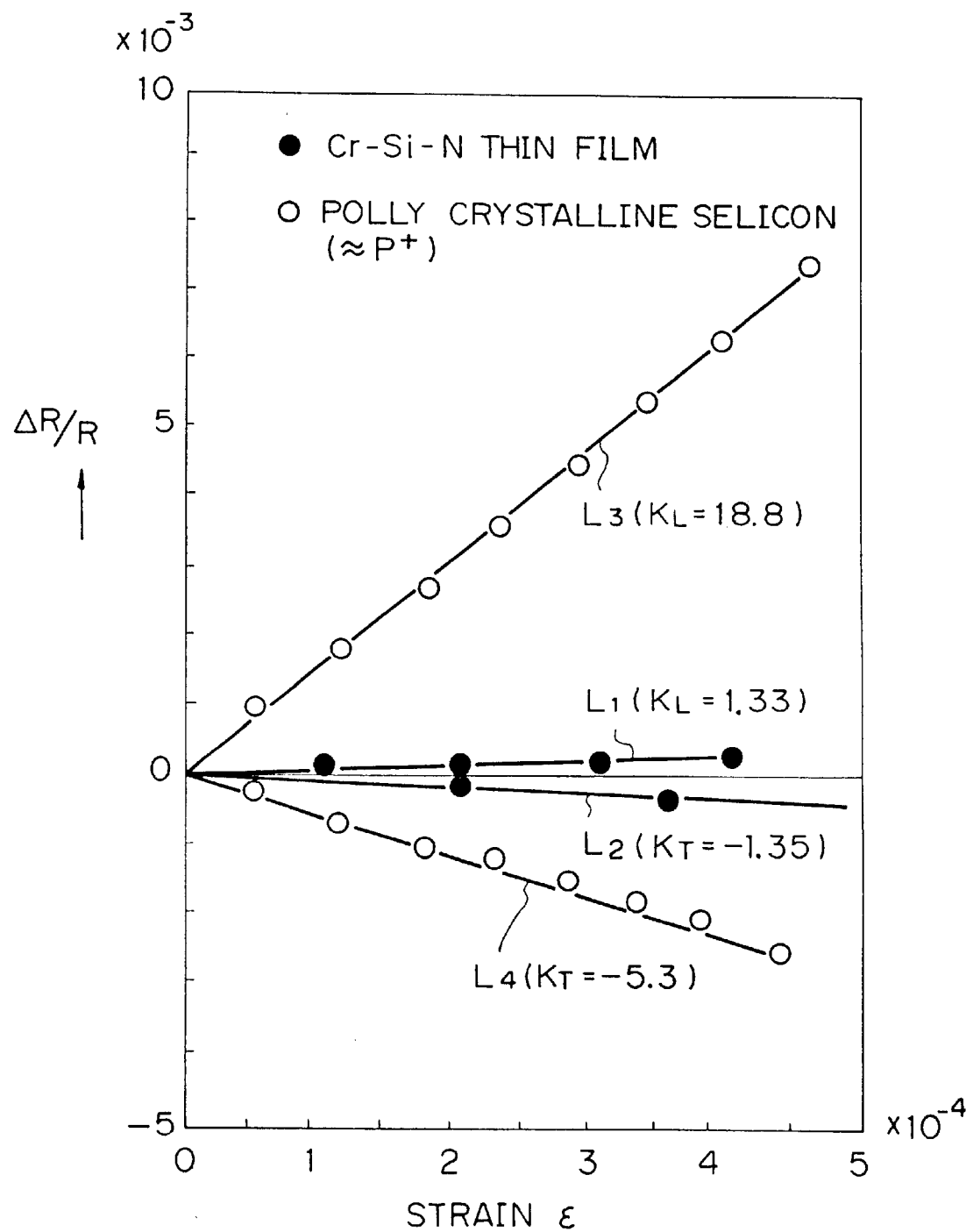
FIG. 20 shows a graph indicating a relationship between a strain and a variation of the resistance value.

FIG. 20 shows a variation of the resistance value (ΔR/R) of the resistors 104 and 105 with respect to the strain of a chip after the packaging is completed, wherein the characteristic curves L1 and L2 represent the cases in which the Cr—Si thin film resistors 108 and 109 are used as the resistors 104 and 105, respectively, and the characteristic curves L3 and L4 represents the cases in which polycrystalline silicon is used as the resistors 104 and 105, respectively.

Figure 21:
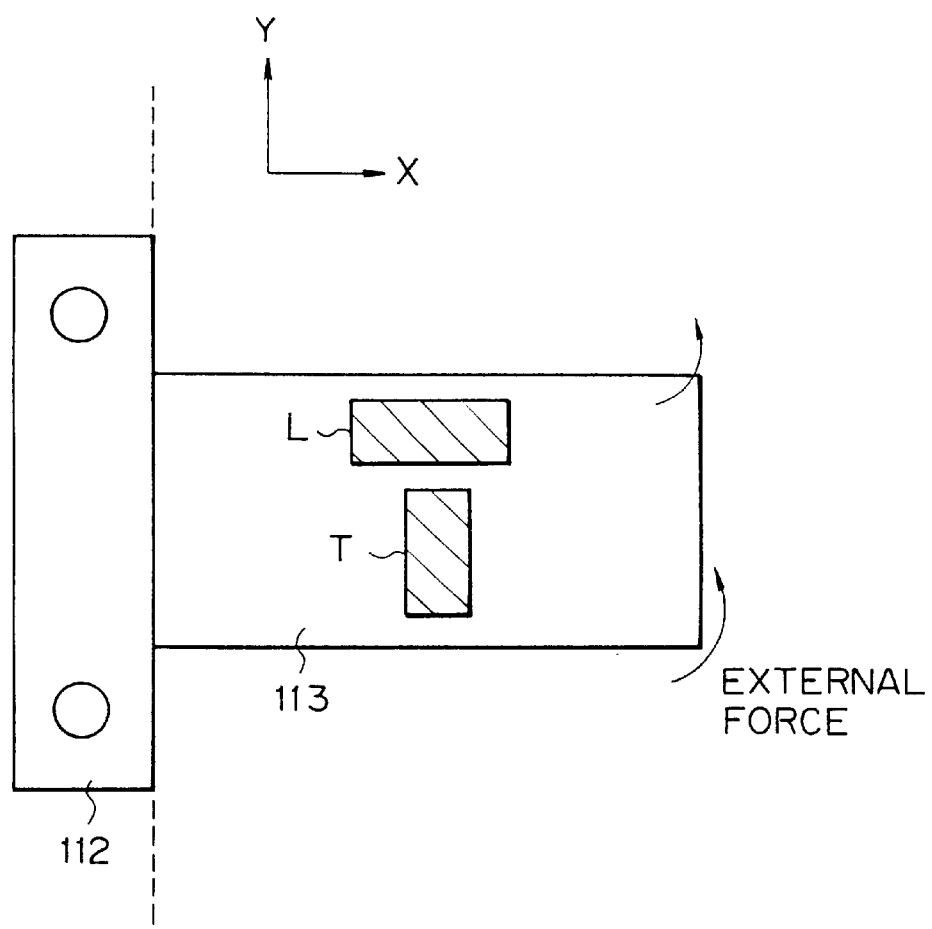
FIG. 21 shows a layout of a thin film resistor arranged on a chip for a atress test.
Figure 22:
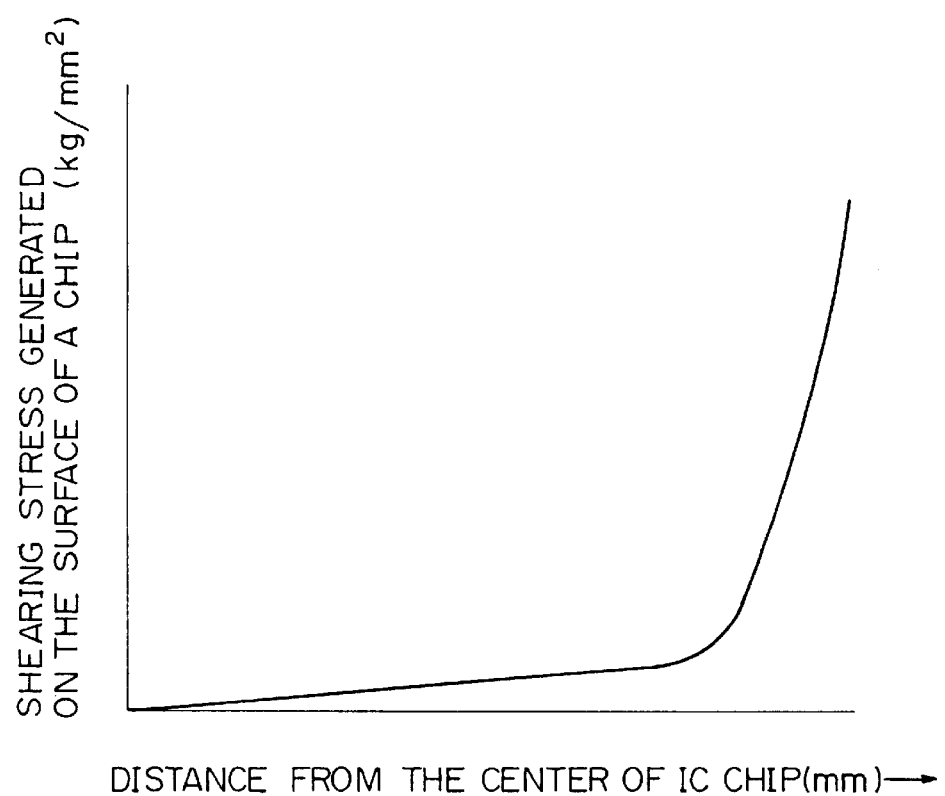
FIG. 22 shows a graph of a distribution of a shearing force.
Figure 23:
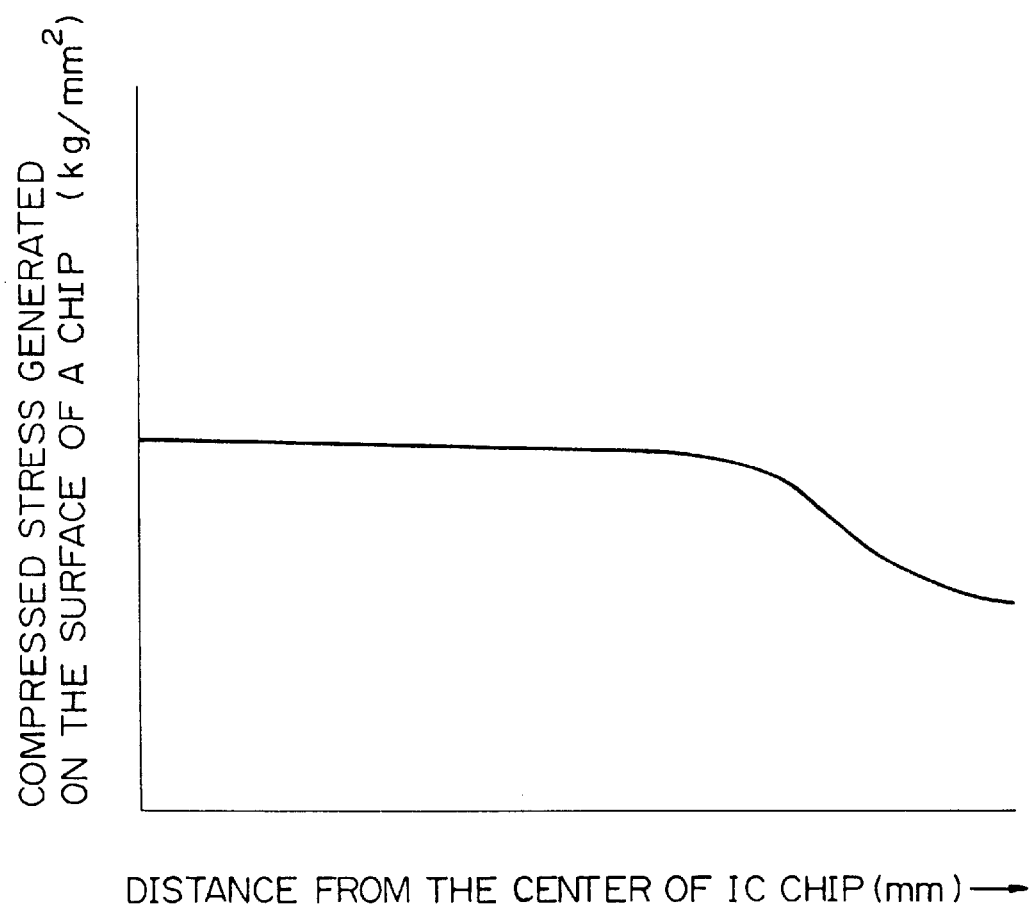
FIG. 23 shows a graph of a distribution of a compressive stress.

As shown in FIG. 20, the two pairs of different characteristic curves (L1 and L2, L3 and L4) represent the results of measurements in which the resistors L and T are respectively mounted on a chip 113 fixed on a supporting vase 112 in such a way that one thereof is arranged so that the longitudinal axis thereof is parallel to the X axis and the other is arranged with the longitudinal axis thereof parallel to the Y axis, and then the resistance is measured by applying a strain to the chip with an external force indicated by an arrow in FIG. 21.

It was confirmed that the variations of the resistance ΔR/R of the polycrystalline silicon resistor and the P$^+$ diffusion resistor with respect to the strain are substantially the same.

When the value of the resistors 104 and 105, after the packaging operation was completed, is assumed to be Δr1+Δr1, r2+Δr2, respectively, (wherein Δr1 and Δr2 denote the variation of the value of the resistance after the molded packaging operation is completed), the output voltage Vout is represented by the following equation;

$$Vout = (Vref + VIO) \times \frac{r1 + r2 + \Delta r1 + \Delta r2}{r1 + \Delta r1}$$

Since the respective pattern arrangements of the resistors 104 and 105 on the chip are not located at exactly the same place on the chip, they must be separate from each other, and therefore the extent of the effect of the stress thereon will be different depending upon the distance from the center of the chip or the difference of the arrangement of the resistors 104 and 105 with respect to the X axis and Y axis which cross each other at a right angle.

Accordingly, when the polycrystalline silicon resistor or the diffusion resistor is used as the resistors 104 and 105, the variation value Δr1 and Δr2 will be varied in every IC package, since the ratios of Δr1 and Δr2 are not constant and the resistors 104 and 105 can not be formed on the same position on the chip in every IC package.

Further, the stress of the molding resin varies in accordance with the variation of the temperature (the lower the temperature, the larger the stress) whereby the value of the resistance is varied.

Conversely, when the Cr—Si—N thin film resistors 108 and 109 are used as the resistors 104 and 105, the variation of the resistance ΔR/R of this film after the resin molded packaging can be reduced to a point where it can be ignored, compared with that of the poly-crystalline silicon resistor and the P$^+$ diffusion resistor. Therefore, the output voltage Vout of the IC after the resin molded packaging can be controlled within the range of 5±0.0075 V (0.15%).

Thus, in this embodiment, a constant voltage IC used for an automobile which is required to maintain the voltage at a high accuracy at 5±0.025 V (0.5%), is produced by forming the resistors 104 and 105 with the Cr—Si—N thin film resistor and by packaging by resin molding method to thereby eliminate variations of the value of the resistance caused by variations of an atmospheric temperature after the packaging or before and after the resin molding process, in completed, and further, caused by the influence of stress variations of the molded resin due to temperature variations caused by heat generation can be suppressed.

Further, when a Cr—Si—N thin film resistor is used as the resistors 104 and 105 instead of the Cr—Si thin film resistor, this semiconductor can be used as an NiCO magnetic resistive device.

The semiconductor device using the thin film resistor of the present invention also can be used as a resistor provided on a portion of a 5 V power source IC used for automobile, without adjustment, other than the portion indicated in FIG. 18.

Moreover, the value of the resistance can be externally adjusted to control variations of the resistance characteristics caused by stress of the molded resin due to temperature variations.

Further, although the semiconductor device using the thin film resistor of the present invention can be used for another type of resin molded package IC having a resistor, for example, an amplifying resistor in a differential amplifier or a resistor for setting a reference voltage in a voltage comparator or the like, variations of the characteristics thereof due to variations of the temperature will cause some problems.

Namely, the semiconductor device using the thin film resistor of the present invention can be used for resin molded package IC in which the resistance of each resister used therein is kept at a constant value.

EFFECT OF THE INVENTION

According to the present invention, the following advantages can be obtained.

In the semiconductor device as shown above, a thin film resistor has a characteristic by which variations of the resistance value due to the temperature variations can be effectively suppressed.

Further, in the method of producing the semi-conductor device having a thin film resistor as mentioned above, a thin film resistor having a characteristic in which variations of the resistance value due to the temperature variations are eliminated can be effectively produced.

Moreover, variations of the resistance value of the resistor provided in resin molded package IC chip caused by temperature variations and variations of the stress of the molded resin can be effectively suppressed.

What is claimed is:

1. A method of producing a semiconductor device having a thin film resistor comprising chromium, silicon and nitrogen, formed on a substrate, said method being characterized in that said thin film resistor forming process consists essentially of the steps of preparing a target consisting essentially of chromium and silicon, wherein the weight percentage of the silicon to the total weight of the chromium and silicon is 41 to 51 weight %, and reactive sputtering a substrate, utilizing said target in an atmosphere of an inert gas containing 1–2% nitrogen gas so as to form a Cr—Si—N thin film having amorphous condition and having the same energy band construction as that of metal, and further characterized in that a thermal treatment is applied to said thin film resistor after said thin film resistor is formed, wherein said thermal treatment is carried out at a temperature not exceeding 500° C., by preventing a temperature in excess of 500° C. from being applied to said thin film resistor, so as to maintain said amorphous condition of said thin film resistor.

2. A method of producing a semiconductor device having a thin film resistor comprising chromium, silicon and nitrogen, formed on a substrate, said method comprising:

a reactive sputtering step in which a Cr—Si target, consisting essentially of chromium and silicon, and the weight percentage of the silicon to the total weight of the chromium and silicon being 41 to 51 weight %, undergoes reactive sputtering in an atmosphere of an inert gas containing 1–2% nitrogen gas, so as to form a Cr—Si—N thin film having amorphous condition and having the same energy band construction as that of metal on said substrate;

a patterning step in which said Cr—Si—N thin film formed on said substrate is etched to remove said film from a surface of said substrate except for a part of said surface of said substrate on which said Cr—Si—N thin film remains;

a wiring step in which first, a conductive film is formed over the entire surface of said substrate utilizing a sputtering method and successive wirings are formed by etching said conductive film; and a sintering step in which said wirings are sintered, wherein a thermal hysteresis applied to said thin film resistor after said thin film resistor has been formed on said substrate, is restricted to less than 500° C., so as to maintain said amorphous condition of said thin film resistor.

* * * * *